United States Patent
Ajuria et al.

(10) Patent No.: US 8,059,380 B2
(45) Date of Patent: Nov. 15, 2011

(54) PACKAGE LEVEL ESD PROTECTION AND METHOD THEREFOR

(75) Inventors: Sergio A. Ajuria, Austin, TX (US); Melanie Etherton, Austin, TX (US); Marc A. Mangrum, Manchaca, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 355 days.

(21) Appl. No.: 12/121,608

(22) Filed: May 15, 2008

(65) Prior Publication Data

US 2009/0284881 A1 Nov. 19, 2009

(51) Int. Cl.
*H02H 1/00* (2006.01)
(52) U.S. Cl. .......... 361/126; 361/56; 361/91.1; 361/111
(58) Field of Classification Search .................. 361/56, 361/91.1, 111
See application file for complete search history.

(56) References Cited

U.S. PATENT DOCUMENTS

| | | | |
|---|---|---|---|
| 5,869,869 A | 2/1999 | Hively | |
| 5,955,762 A | 9/1999 | Hively | |
| 6,351,011 B1 * | 2/2002 | Whitney et al. | 257/355 |
| 7,218,492 B2 | 5/2007 | Shrier | |
| 7,274,048 B2 | 9/2007 | Wu | |
| 7,285,846 B1 | 10/2007 | Tran | |
| 2006/0061925 A1 | 3/2006 | Shrier | |
| 2007/0127175 A1 | 6/2007 | Shrier | |
| 2008/0278873 A1 * | 11/2008 | Leduc et al. | 361/56 |
| 2009/0097175 A1 * | 4/2009 | Chiu et al. | 361/56 |

OTHER PUBLICATIONS

Shrier et al; "Embedding a Thin Polymer Voltage ESD Suppressing Core in a Chip Package-Alternative to on Chip ESD Protection"; 16th European Microelectronics and Packaging Conference & Exhibition, Oulu, Finland, Jun. 2007.

* cited by examiner

*Primary Examiner* — Jared Fureman
*Assistant Examiner* — Terrence Willoughby
(74) *Attorney, Agent, or Firm* — James L. Clingan, Jr.

(57) ABSTRACT

A semiconductor package includes an electrostatic discharge rail capable of being coupled to a first conductive contact and a second conductive contact, a first portion of a voltage triggerable material between the electrostatic discharge rail and the first conductive contact; and a second portion of the voltage triggerable material between the electrostatic discharge rail and the second conductive contact. The first and second conductive contacts may be coupled to the same semiconductor device or different semiconductor devices.

4 Claims, 5 Drawing Sheets

US 8,059,380 B2

PACKAGE LEVEL ESD PROTECTION AND METHOD THEREFOR

BACKGROUND

1. Field

This disclosure relates generally to ESD protection of an integrated circuit, and more specifically, to ESD protection of an integrated circuit at a package level.

2. Related Art

Electrostatic Discharge (ESD) has been and continues to be a problem with integrated circuits. During ESD events potentially damaging voltages can develop across two conductive contacts of an integrated circuit. Much effort is spent to provide adequate ESD protection for the conductive contacts on an integrated circuit. A significant portion of the area used for the input/output circuitry is occupied by ESD protection. This on-chip ESD protection can add significant capacitance on input/output (I/O) conductive contacts, which can compromise the performance of the chip. One of the ways to reduce some of the space required for ESD protection on the integrated circuit and/or to increase the protection against ESD events while also reducing the capacitive load on input/output pins is to provide ESD protection at the package level. In such a case, ESD protection is incorporated in the package which contains the integrated circuit. Such ESD protection, however, is often difficult to achieve reliably and also may be costly to implement because of extensive additional package assembly processing.

Thus, there is a need for package level ESD protection that improves upon the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a package device that includes an integrated circuit uses a polymeric material outside the integrated circuit as a triggerable conductive path between two conductive contacts that may receive an electrostatic discharge (ESD) event. In close proximity to each conductive contact is a conductive rail so that the polymeric material between the conductive contact and the conductive rail functions as a voltage triggerable material with sufficiently low resistance to provide effective ESD protection. The polymeric material functions as a non-conductive material until a high voltage is applied. When a voltage threshold is reached, the voltage triggers an operational change in the polymeric material so that the polymeric material becomes conductive. The charge associated with an ESD event is thus dissipated between the two conductive contacts through the now conductive polymeric material and across the conductive rail during an ESD event. This allows for reducing the space required for ESD protection on the integrated circuit and/or improving ESD performance. This is better understood by reference to the drawings and the following description.

Figure 1:
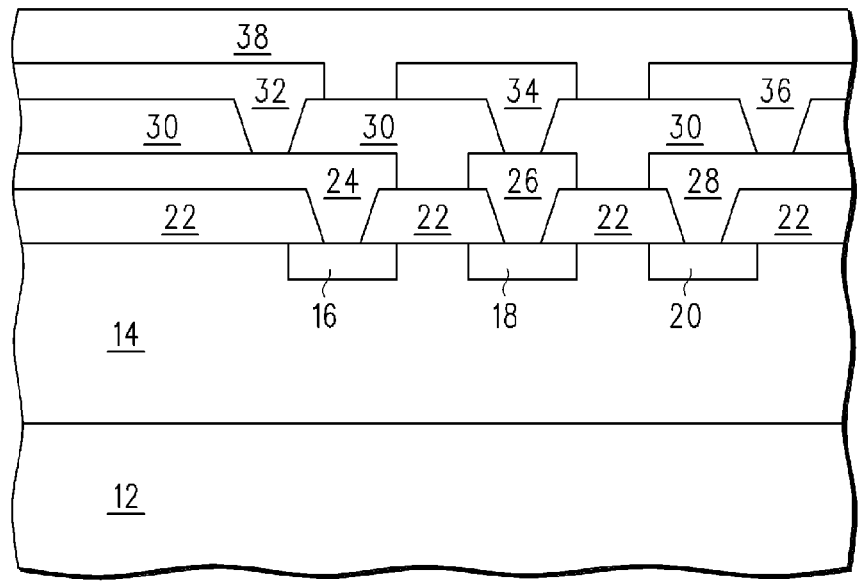
FIG. 1 is a cross section of a package device at a stage in processing according to an embodiment.

Shown in FIG. 1 is packaged device 10 comprising an encapsulant 12; an integrated circuit 14 substantially encapsulated by encapsulant 12; contacts 16, 18, and 20 on a top surface of integrated circuit 14; a dielectric layer 22 over the top surface of integrated circuit 14; a via and conductive line 24 in contact with contact 16 through dielectric layer 22; a via and conductive line 26 in contact with contact 18 through dielectric layer 22; a via and conductive line 28 in contact with contact 20 through dielectric layer 22; a dielectric layer 30 over dielectric layer 22 and via and conductive lines 24, 26, and 28; a via and conductive line 32 in contact with via and conductive line 24 through dielectric layer 30; a via and conductive line 34 in contact with via and conductive line 26 through dielectric layer 30; a via and conductive line 36 in contact with via and conductive line 28 through dielectric layer 30; and a dielectric layer 38 over dielectric layer 30 and via and conductive lines 32, 34, and 36. Dielectric layers 22, 30, and 38 may be made from a photo-imageable dielectric material that is known to be used for forming a redistributed chip packaging (RCP). Contacts 16, 18, and 20 and via and conductive lines 24, 26, 28, 32, 34, and 36 may be formed by conventional plating and evaporative deposition processes. Encapsulation 12 is shown on bottom of integrated circuit 14 but not shown, due to only a portion of integrated circuit 14 being shown, is that encapsulation 12 extends to sides of integrated circuit 14.

Figure 2:
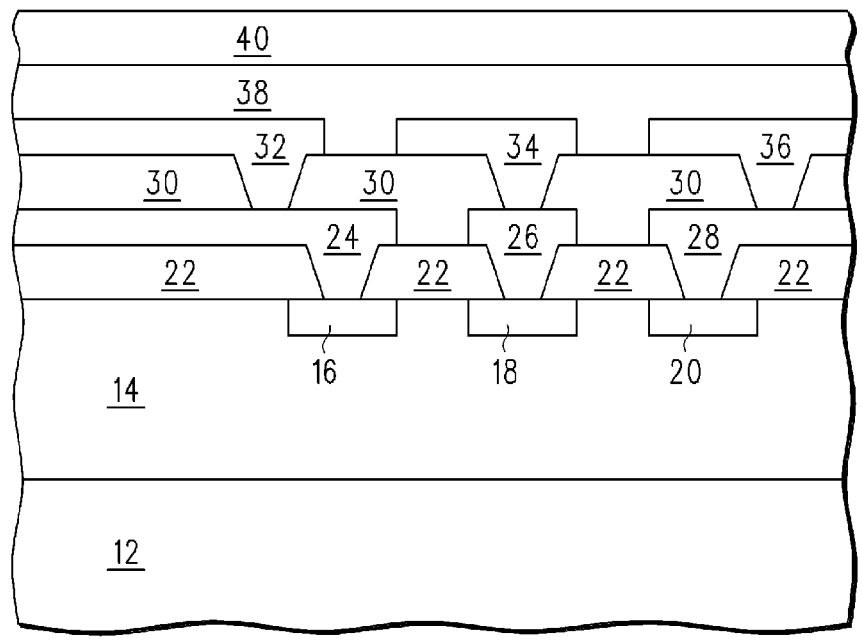
FIG. 2 a cross section of the package device of FIG. 1 at a subsequent stage in processing.

Shown in FIG. 2 is packaged device 10 after depositing a layer of voltage triggerable material 40. Voltage triggerable material 40 is a polymeric material that may be deposited by a spin-on process. The deposition is relatively planar. Voltage triggerable material is a polymeric material that is known to have a functional change when a high enough voltage is applied across it. The functional change is from being non-conductive to being conductive. The trigger voltage is selectable based on the composition of the polymeric material. One example of such a voltage triggerable material is a polyaniline called ORMECON by Zipperling Kessler of Germany. Another such polyaniline is available from American Dye Source, Inc., of Quebec, Canada. Yet another company is Penipol in Finland.

Figure 3:
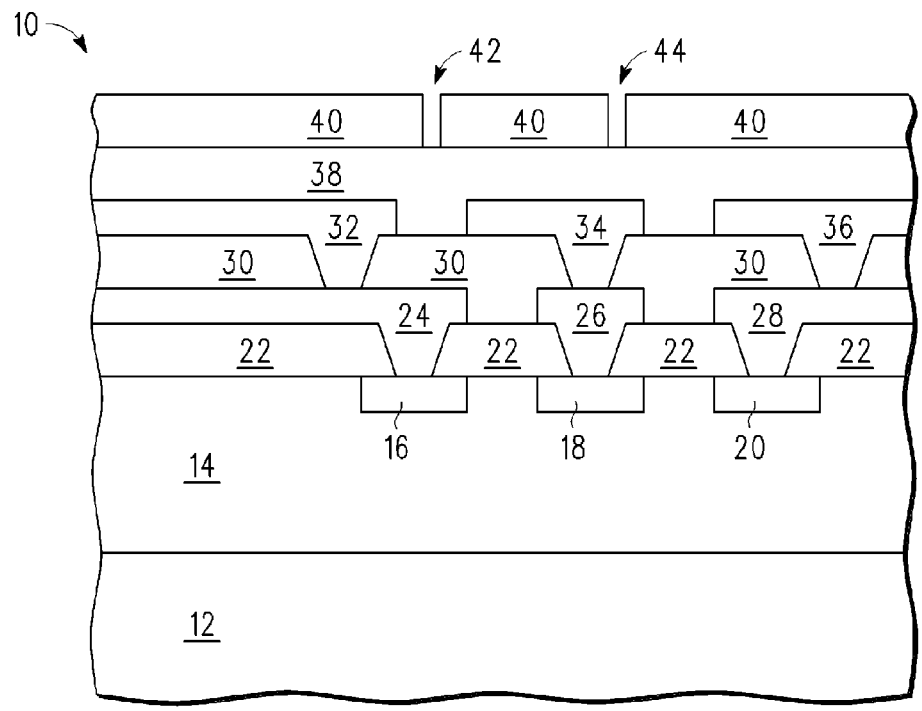
FIG. 3 a cross section of the package device of FIG. 2 at a subsequent stage in processing.

Shown in FIG. 3 is packaged device 10 after forming openings 42 and 44 in voltage triggerable material 40. These openings are illustrated as narrow compared to the openings used for vias but are well within the capability of the lithography and etch capabilities of semiconductor manufacturing and do not have to narrow in every case. The via openings are relatively large due to being part of the external connection of the integrated circuit. Openings 42 and 44 extend to other areas of packaged device 10 not shown in FIG. 3 and continue to an area where there is a common opening.

Figure 4:
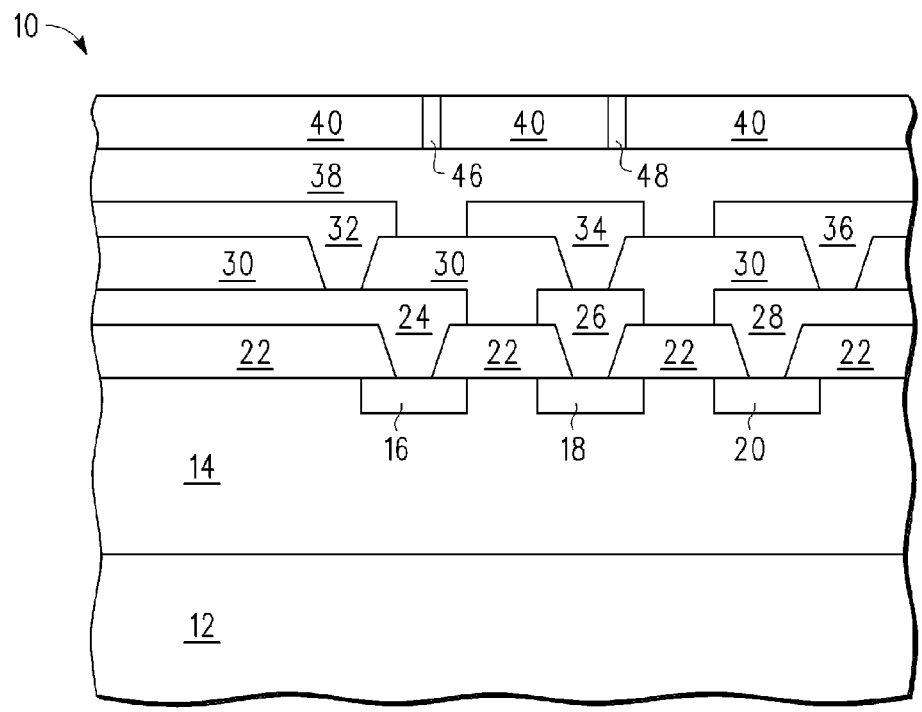
FIG. 4 a cross section of the package device of FIG. 3 at a subsequent stage in processing.

Shown in FIG. 4 is packaged device 10 after filling openings 42 and 44 of FIG. 3 with conductive material to form rail 46 and rail 48, respectively. This is achieved using known plating techniques. Rails 46 and 48, although not shown in FIG. 4, are connected directly or through another rail. Either way, rails 46 and 48 have a direct electrical connection.

Figure 5:
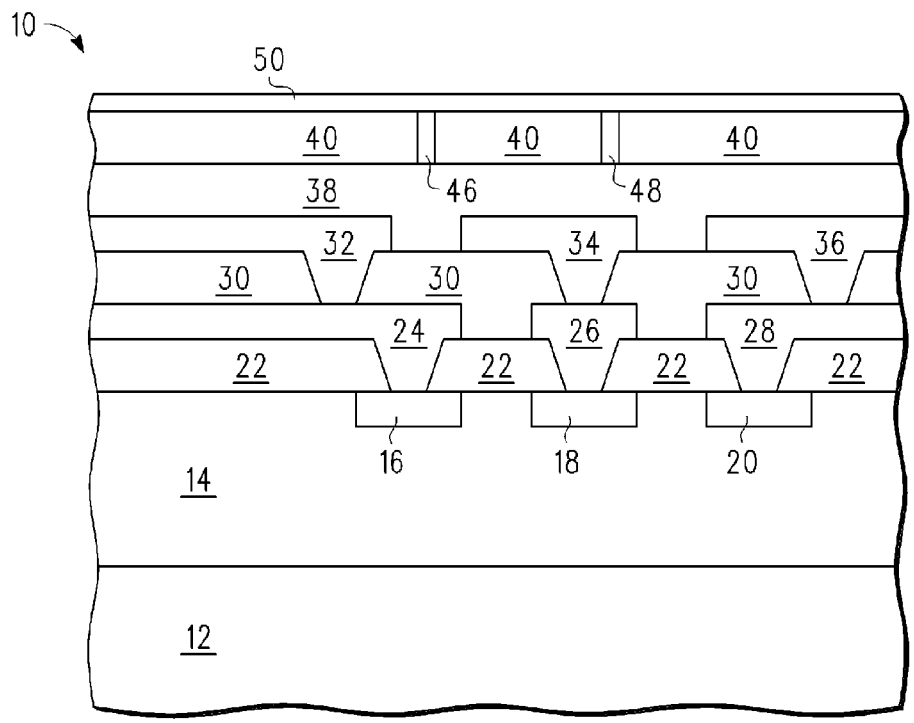
FIG. 5 a cross section of the package device of FIG. 4 at a subsequent stage in processing.

Shown in FIG. 5 is packaged device 10 after forming a dielectric layer 50 over voltage triggerable material 40 and rails 46 and 48. Dielectric material may be of the same material as layers 22, 30, and 38 but can be thinner, for example about a fourth the thickness. Implementation of this dielectric layer may not be necessary depending on the environmental resistance properties of the voltage triggerable material.

Figure 6:
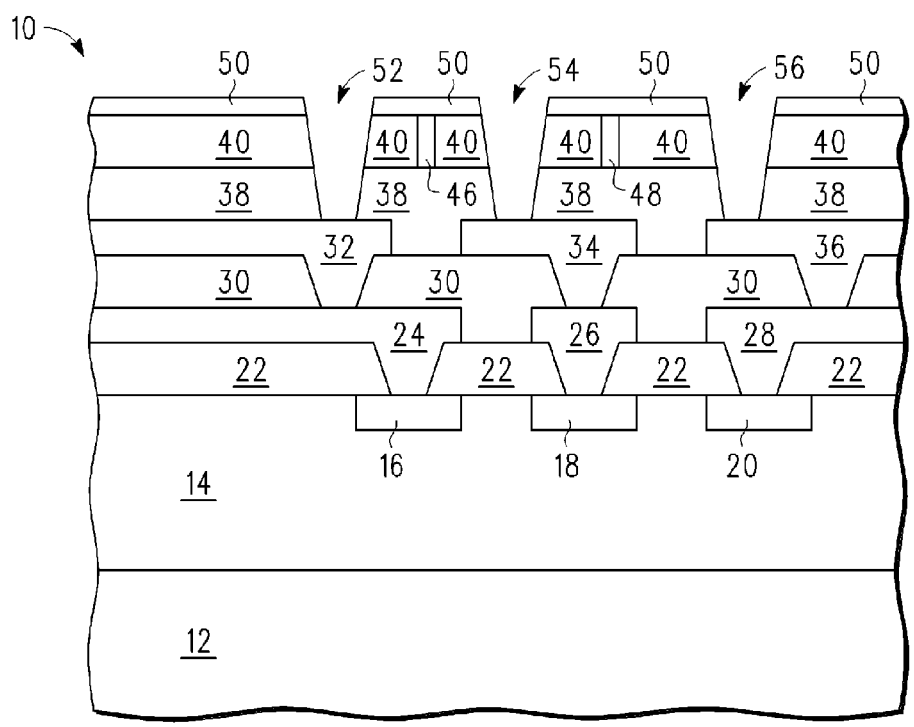
FIG. 6 a cross section of the package device of FIG. 5 at a subsequent stage in processing.

Shown in FIG. 6 is packaged device 10 after forming an opening 52, opening 54, and opening 56 through layer 50, voltage triggerable material 40, and dielectric layer 38 to via and conductive line 32, via and conductive line 34, and via and conductive line 36, respectively. These openings may be evenly spaced so that the distances from fill 48 to opening 56, from fill 48 to opening 54, from rail 46 to opening 54, and from rail 46 to opening 52 are the same. Even spacing may be beneficial in some cases but uneven spacing may be beneficial, especially if there are different voltage requirements for different pins.

Figure 7:
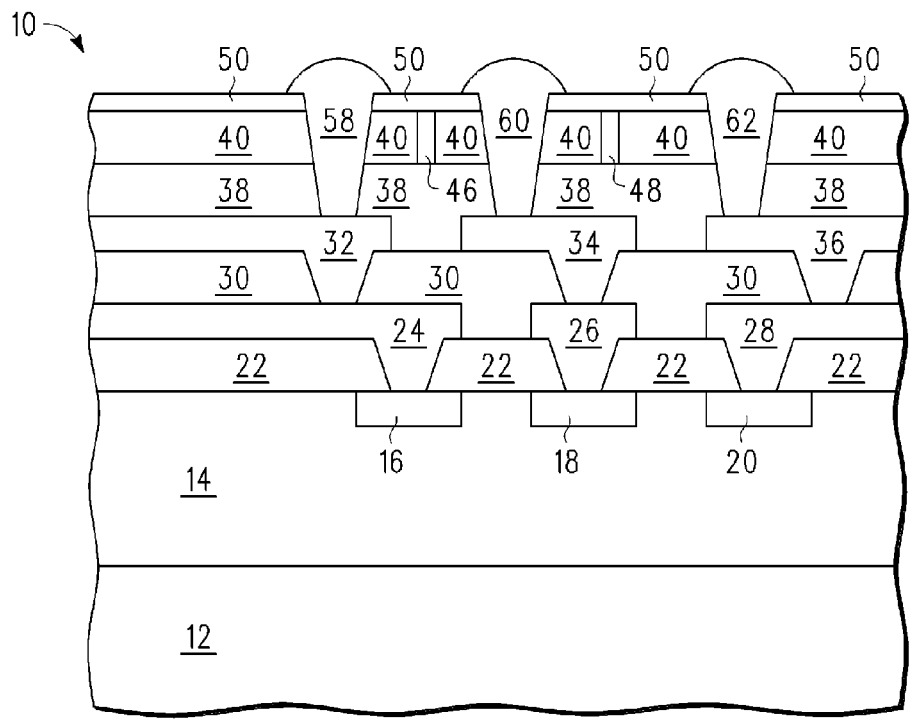
FIG. 7 a cross section of the package device of FIG. 6 at a subsequent stage in processing.

Shown in FIG. 7 is packaged device 10 after openings 52, 54, and 56 have been filled to form solder contacts 58, 60, and 62, respectively, for use in directly connecting to a circuit board or other equipment for being connected to a packaged integrated circuit. Solder contacts 58, 60, and 62 may be plated as is commonly performed. Another possibility is to place solder spheres and perform a reflow.

Figure 8:
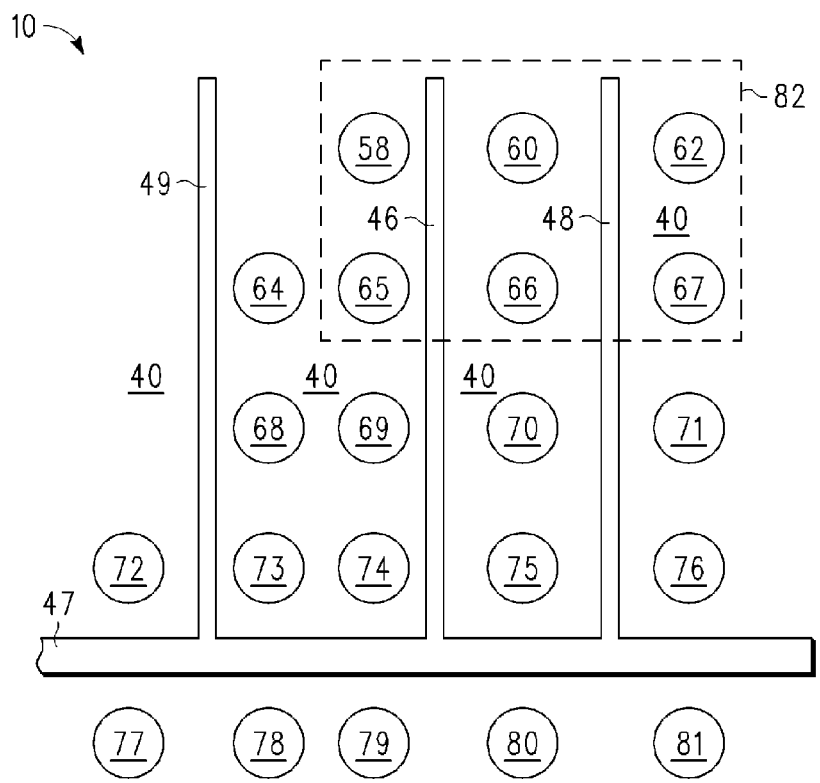
FIG. 8 is a top view of the package device of FIG. 7.

Shown in FIG. 8 is packaged device 10 of FIG. 7 but viewed as if dielectric layer 50 were not present. Packaged device 10 shows an array of solder contacts 58, 60, 62, and 64-81 surrounded by voltage triggerable material 40. Through the array are also rails 46 and 48 and rails 47 and 49. The rows and columns of rails are shown as having different sizes but they can be the same or different than shown. In this example, in addition to the row comprised of solder contacts 58, 60, and 62 there are row of solder contacts, 64-67, 68-71, 72-76, and 77-81. Rail 47 passes between and in close proximity to row of contacts 72-76 and row of contacts 77-81. In this configuration contacts 64 and 68 are only in close proximity to rail 49 which is orthogonal to rail 47. Solder contacts 72 and 73 are in close proximity to rails 47 and 49. Solder contacts 58, 60, 65, 66, 69, 70, 74, and 75 are in close proximity to rails 46. Contact 75 is in close proximity to rails 47, 46, and 48. Contacts 62, 67, 71, and 76 are in close proximity to rail 48. All of contacts 58, 60, 62, and 64-81 are in close proximity to at least one rail with voltage triggerable material 40 therebetween. There is also shown a grouping 82 of solder contacts which includes solder contacts 58, 60, 62, and 65-67 and rails 46 and 48.

Figure 9:
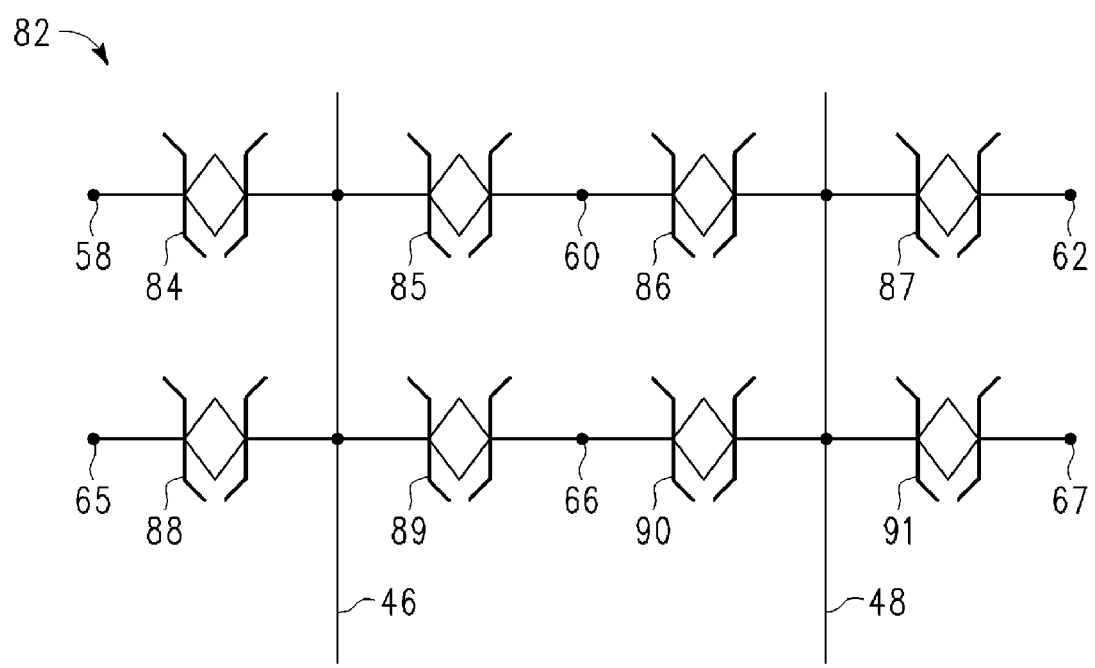
FIG. 9 is a circuit diagram of a portion of the package device of FIG. 8.

Shown in FIG. 9 is grouping 82 in circuit diagram form. In addition to contacts 58, 60, 62, and 65-67 shown as nodes and rails 46 and 48 shown as conductors, also shown are voltage triggerable devices 84-91. Voltage triggerable devices are formed of voltage triggerable material between two conductors. In this case the voltage triggerable material is voltage triggerable material 40. Triggerable voltage device 84, for example, is voltage triggerable material 40 between rail 46 and solder contact 58. Voltage triggerable device 84, in FIGS. 7 and 8, is present in the region between contact 58 and rail 46. Similarly, voltage triggerable device 85 is voltage triggerable material 40 between solder contact 60 and rail 46 as shown in FIGS. 7 and 8. Voltage triggerable devices 84-91 are thus two terminal devices that function as insulators until sufficient voltage, which may be called the trigger voltage, arises across the two terminals to cause the device to function as a conductor. After the current dissipates, the device reverts back, unharmed, to the condition of being an insulator. There is not known to be a commonly accepted symbol used for voltage triggerable devices 84-91. Thus, the symbol used in FIG. 9 is presumably original.

Voltage triggerable device 84 has a first terminal coupled to contact 58 and a second terminal coupled to rail 46. Voltage triggerable device 85 has a first terminal coupled to contact 60 and a second terminal coupled to rail 46. Voltage triggerable device 86 has a first terminal coupled to contact 60 and a second terminal coupled to rail 48. Voltage triggerable device 87 has a first terminal coupled to contact 62 and a second terminal coupled to rail 48. Voltage triggerable device 88 has a first terminal coupled to contact 65 and a second terminal coupled to rail 46. Voltage triggerable device 89 has a first terminal coupled to contact 66 and a second terminal coupled to rail 46. Voltage triggerable device 90 has a first terminal coupled to contact 66 and a second terminal coupled to rail 48. Voltage triggerable device 91 has a first terminal coupled to contact 67 and a second terminal coupled to rail 48.

Functionally, an ESD event of sufficient magnitude to invoke the requirement for protection between any two solder contacts will result in the two voltage controlled devices adjacent to the solder contacts becoming conductive to couple the solder contacts to the adjacent rails. Because the rails are interconnected, the event is dissipated in the rails. For example, for the case of an ESD event between contact 58 and contact 67, voltage triggerable devices 84 and 91 become conductive and thus couple contacts 58 and 67 to rails 46 and 48, respectively. As shown in FIG. 8, rails 46 and 48 are interconnected through rail 47. There is thus a relatively low resistance path provided between contacts 58 and 67 through voltage triggerable device 84, rail 46, rail 47, rail 48, and voltage triggerable device 91. Further this relatively low resistance path is present regardless of the polarity of the ESD event because the voltage triggerable devices operate in a symmetrical manner. This ESD protection is thus provided external to integrated circuit 14 but protects integrated circuit 14. This can be used to reduce the amount of ESD protection on integrated circuit 14 and thus reduce the cost of integrated circuit 14 and reduce the capacitive load on the contact, which will improve electrical performance. On the other hand, this ESD protection may provide a type of protection not present on the integrated circuit, such as providing protection at a higher voltage, which can be used in combination with the ESD protection on the integrated circuit to improve the overall performance of the ESD protection of the packaged device.

By now it should be appreciated that there has been provided a semiconductor package. The semiconductor package includes a first semiconductor device. The semiconductor package further includes a first conductive contact coupled to the first semiconductor device. The semiconductor package further includes an electrostatic discharge rail capable of being coupled to the first conductive contact and a second conductive contact. The semiconductor package further includes a first portion of a voltage triggerable material between the electrostatic discharge rail and the first conductive contact. The semiconductor package further includes a second portion of the voltage triggerable material between the electrostatic discharge rail and the second conductive contact. The semiconductor package may be further characterized by the first conductive contact comprising a first solder contact and the second conductive contact comprising a second solder contact. The semiconductor package may further comprise a first contact and a second contact within the first semiconductor device, wherein the first contact is coupled to the first solder contact, and the second contact is coupled to the second solder contact. The semiconductor package may further comprise a dielectric layer formed over the voltage triggerable material and the electrostatic discharge rail. The semiconductor package may be further characterized by the electrostatic discharge rail comprising copper. The semiconductor package may be further characterized by the voltage triggerable material comprising a polymeric material capable of being conductive. The semiconductor package may be further characterized by the voltage triggerable material being capable of functioning as a discharge path. The semiconductor package may be further characterized by the electrostatic discharge rail being capable of being coupled to the first conductive contact and the second conductive contact during an electrostatic discharge event. The semiconductor package may be further characterized by the first conductive contact and the second conductive contact being formed over the first semiconductor device. The semiconductor package may further comprise a second semiconductor device, wherein the second conductive contact is coupled to the second semiconductor device.

Also described is method of forming a semiconductor package. The method includes providing a first semiconductor device. The method further includes coupling a first conductive contact to the first semiconductor device. The method further includes forming an electrostatic discharge rail capable of being coupled to the first conductive contact and a second conductive contact. The method further includes providing a voltage triggerable material comprising a first portion of a voltage triggerable material between the electrostatic discharge rail and the first conductive contact and a second portion of the voltage triggerable material between the electrostatic discharge rail and the second conductive contact. The method may further comprise providing a second semiconductor device and the second conductive contact to the second semiconductor device. The method may further comprise forming a dielectric layer over the voltage triggerable material and the electrostatic discharge rail. The method may be further characterized by the forming the electrostatic discharge rail comprising forming openings within the voltage triggerable material and depositing copper within openings in the voltage triggerable material. The method may be further characterized by forming the electrostatic discharge rail comprising depositing a conductive material and patterning the conductive material to form the electrostatic discharge rail, wherein providing the voltage triggered material comprises the voltage triggered material after patterning the conductive material. The method may further comprise forming the first conductive contact over the first semiconductor device and forming the second conductive contact over the first semiconductor device.

Described also is a semiconductor package. The semiconductor package includes a semiconductor device. The semiconductor package further includes a plurality of conductive contacts coupled to the semiconductor device. The semiconductor package further includes an electrostatic discharge layer formed over the semiconductor device. The electrostatic discharge layer comprises a voltage triggerable material, an electrostatic discharge rail, and a portion of each of the plurality of conductive contacts. The portion of each of the plurality of conductive contacts is coupled to a portion of the electrostatic discharge rail and is coupled to a portion of the voltage trigger material that is between the each of the plurality of conductive contacts and the portion of the electrostatic discharge rail. The semiconductor package may be further characterized by the voltage triggerable material comprising a polymeric material capable of being conductive. The semiconductor package may be further characterized by the voltage triggerable material being capable of functioning as a discharge path during an electrostatic discharge event. The semiconductor package may be further characterized by the electrostatic discharge rail being capable of coupling a plurality of conductive contacts during an electrostatic discharge event.

Although the invention is described herein with reference to specific embodiments, various modifications and changes can be made without departing from the scope of the present invention as set forth in the claims below. For example, the ESD protection is described as being applied to a single integrated circuit, but the ESD protection comprising a system of connected rails could apply to more than one integrated circuit that is combined into the same package and further may provide ESD protection to passive devices or discrete devices. Although the electrical interface of the packaged device is described as being with solder contacts, another type of external electrical interface, such as a bare pad, bump, or lead, could be used for the external electrical interface. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor package comprising:
   a semiconductor device;
   a plurality of conductive contacts coupled to the semiconductor device comprising a first contact, a second contact, a third contact, and a fourth contact;
   an electrostatic discharge layer formed over the semiconductor device, wherein
      the electrostatic discharge layer comprises:
      a voltage triggerable material forming a first voltage controlled device, a second voltage controlled device, a third voltage controlled device, and a fourth voltage controlled device; and
      a first electrostatic discharge rail between the first contact and the second contact and a second electrostatic discharge rail interconnected with the first electrostatic discharge rail and between the third contact and the fourth contact;
      wherein a first terminal of the first voltage controlled device and a first terminal of the second voltage controlled device are coupled to a portion of the first electrostatic discharge rail, a second terminal of the first voltage controlled device is coupled to the first contact, and a second terminal of the second voltage controlled device is coupled to the second contact, a first terminal of the third voltage controlled device and a first terminal of the fourth voltage controlled device are coupled to a portion of the second electrostatic discharge rail, a second terminal of the third voltage controlled device is coupled to the third contact, and a second terminal of the fourth voltage controlled device is coupled to the fourth contact.

2. The semiconductor package of claim 1, wherein the voltage triggerable material comprises a polymeric material capable of being conductive.

3. The semiconductor package of claim 2, wherein the voltage triggerable material is capable of functioning as a discharge path during an electrostatic discharge event.

4. The semiconductor package of claim 1, wherein the electrostatic discharge rail is capable of coupling a plurality of conductive contacts during an electrostatic discharge event.

* * * * *